(12) United States Patent
Lautenschläger

(10) Patent No.: US 7,522,845 B2
(45) Date of Patent: Apr. 21, 2009

(54) WDM LASER WAVELENGTH CONTROL

(75) Inventor: Wolfram Lautenschläger, Sachsenheim (DE)

(73) Assignee: Alcatel, Paris (FR)

( * ) Notice: Subject to any disclaimer, the term of this patent is extended or adjusted under 35 U.S.C. 154(b) by 348 days.

(21) Appl. No.: 11/180,736

(22) Filed: Jul. 14, 2005

(65) Prior Publication Data
US 2006/0013588 A1    Jan. 19, 2006

(30) Foreign Application Priority Data
Jul. 15, 2004    (EP) .................................. 04291802

(51) Int. Cl.
*H04B 10/04* (2006.01)

(52) U.S. Cl. ..................... 398/196; 398/79; 398/195; 398/197; 398/162; 398/93; 398/94; 398/95; 398/33; 398/34; 398/202; 398/208; 398/209; 398/210; 398/214; 398/158; 398/159; 372/32; 372/34; 372/36; 372/38.02

(58) Field of Classification Search ................. 398/195, 398/196, 79, 33, 197, 25, 198, 26, 200, 27, 398/186, 192, 193, 194, 202, 208, 209, 210, 398/214, 141, 158, 159, 182, 183, 199, 140, 398/162, 34, 94, 95, 93; 372/32, 34, 36, 372/38
See application file for complete search history.

(56) References Cited

U.S. PATENT DOCUMENTS

| | | | |
|---|---|---|---|
| 5,673,129 A | 9/1997 | Mizrahi | |
| 6,031,644 A * | 2/2000 | Utsumi | ......................... 398/27 |
| 6,233,262 B1 | 5/2001 | Weiss et al. | |
| 6,349,103 B1 | 2/2002 | Jang et al. | |
| 6,545,507 B1 | 4/2003 | Goller | |
| 7,113,700 B2 * | 9/2006 | Shimizu et al. | ............... 398/33 |

FOREIGN PATENT DOCUMENTS

| | | |
|---|---|---|
| EP | 1 453 239 A1 | 9/2004 |
| EP | 1 469 630 A1 | 10/2004 |

OTHER PUBLICATIONS

ITU: Draft new Recommendation 0.201: Q-Factor Test Equipment to Estimate the Transmission Performance of Optical Channels, pp. 1320-1224, Feb. 2003.

Wurzer, M. et al. A 40/Gb/s Integrated Clock and Data Recovery Circuit in a 50gHz $fT$ Silicon Bipolar Technology, IEEE Journal of Solid-State Circuits. vol. 34, No. 9, Sep. 1999.

(Continued)

*Primary Examiner*—Hanh Phan
(74) *Attorney, Agent, or Firm*—Sughrue Mion, PLLC

(57) ABSTRACT

A transmitter (11) emits a single wavelength optical signal and transmits this as a wavelength channel (13) in a compound multiplex signal through the WDM network. The receiver (12) selects the single wavelength optical signal (21) from the compound multiplex signal using a band-pass filter. A wavelength fit detector (15) determines a feedback signal by correlating variations of the amplitude of the received signal with variations of the traffic density. This feedback signal is then returned to the transmitter (11) via a back channel (16) and serves to tune the wavelength of the single wavelength optical signal.

15 Claims, 3 Drawing Sheets

OTHER PUBLICATIONS

Hogge Jr., Charles R., A Self Correcting Clock Recovery Circuit, IEEE Journal on Lightwave Technology, vol. LT-3, pp. 1312-1314, Dec. 1985.

Lautenschlaeger, W "Input Data Stream Transferring Method and Input Circuit," Unpublished Application, Alcatel FIT 114220, filed Jul. 28, 2003, pp. 1-19.

ITU: Study group 15-contribution: Bit-Error-Rate, Q-Factor, E1.SNR and OSNR relations for single channel long-haul systems with optical amplifier in draft recs. G.691a, and G691b and G.onp, Nov. 1997.

Gardner, Floyd Martin, "Phase-locked Techniques," John Wiley & Sons, 1979.

F.H. Lange, "Signale and Systeme," Band 3, Regellose Vorgange, Verlag Technik Berlin, 1973.

G. Fritzsche, Theoretische Grundlagen der Nachrichtentechnik, Verlag Technik Berlin, 1972.

Wolde, J. et al. "Optical Ethernet metro access network prototype: Implementation and results".

J. Bauwelinck, et al. "DC-coupled burst-mode transmitter for 1.25 Gbit/s upstream PON," Electronics Letters Apr. 15, 2004, pp. 501-502, vol. 40, No. 8.

S. Hann, et al. "Uni-lanbda bidirectional 10/1.25 GbE access service based on WDM-PON." Electronics Letters, Feb. 5, 2004, pp. 194-195 vol.40, No. 3.

Lautenshlaeger, W. "Automatic wavelength control in optical burst mode," Electronics Letters, Oct. 14, 2004, pp. 1364-1365 vol. 40, No. 21.

* cited by examiner

WDM LASER WAVELENGTH CONTROL

The invention is based on a priority application EP 04291802.9 which is hereby incorporated by reference.

FIELD OF THE INVENTION

The present invention relates to the field of telecommunications and more particularly to a method and corresponding apparatus for controlling the wavelength of a laser in a wavelength division multiplex system.

BACKGROUND OF THE INVENTION

Optical wavelength division multiplex systems (WDM) use multiple laser beams on different wavelengths to transmit simultaneously multiple data channels over a common optical fiber. On the receiving side the channels are separated by wavelength filters. The narrower the filter pass-bands, the more channels can be placed. For correct operation, the laser wavelength of a particular transmitter must fit to the pass band of the wavelength selector at the receiver side.

The requirement, that laser wavelength and filter pass-band must not diverge from each other is challenging with decreased filter bandwidth. Nevertheless, in existing systems, there is no means to actively control the wavelength fit between laser and filter. Conversely, lasers are offline tuned to the absolute wavelength values as defined by the ITU wavelength grid. The laser wavelength is tuned offline by temperature under control of an optical spectrum analyzer. Later in the field, i.e. during normal operation, the established temperature set point is kept constant.

Optical burst mode by its nature cannot guarantee constant optical power in the laser. Dense traffic yields high average power, sparse traffic results in low average power. The traffic density can change at any time scale, ranging from milliseconds to hours or years. Most optical packet sources react to power changes with small wavelength deviations. The filter pass-bands must thus be made large enough to absorb the remaining tolerances. Moreover, this strategy requires a high degree of long term stability of the laser device itself as well as its driving circuitry with respect to ageing and environmental changes.

Semiconductor laser devices are in principle tunable. However, this inherent tunability of a laser cannot be used today, because there is no simple feedback available regarding the actual wavelength. The indirect control by temperature and laser current is technically usable only for a fix set point. Even the tunability of laser power (required in TDMA burst mode) is critical, as the laser power influences the wavelength at constant temperature.

In general, WDM lasers are temperature controlled by a thermo-electrical cooler (TEC) under control of a thermistor. However, between the active zone of a laser chip and the basement remains a small temperature difference, which is outside of the control loop. Even with ideal temperature control of the basement, this temperature difference (and thus the wavelength) of the active laser zone is power dependent. If power changes, the wavelength will change too, certainly with some delay. FIG. 3 shows the measured thermal wavelength transient of a temperature stabilized DFB laser when switched between zero and nominal power. The transient starts within the first micro second, but it settles only after tens of milliseconds (logarithmic time scale!). In translation to the above mentioned burst mode traffic dependence, the left side of FIG. 3 corresponds to a sparse flow of short packets (<1 μs). The right side corresponds to a 100% occupied channel. Transitions between both operating conditions can take place at any time and last for undetermined period. State-of-the-art temperature controllers are by 6 or 7 decades to slow to compensate this effect. Nevertheless, the wavelength shift (0.5 nm) is, even if not compensated, still in range of a 200 GHz ITU wavelength grid with 1.6 nm channel spacing.

It is an object of the present invention to improve the wavelength control of a laser in a WDM system.

SUMMARY OF THE INVENTION

These and other objects that appear below are achieved by a wavelength fit detector which determines in a wavelength division multiplex system whether a received signal wavelength matches a predefined pass-band of a wavelength selector by correlating variations of the amplitude of the received signal with variations of the traffic density to determine a feedback signal for the laser light source emitting the signal.

In particular, a transmitter emits a single wavelength optical signal and transmits this as a wavelength channel in a compound multiplex signal through the WDM network. The receiver selects the single wavelength optical signal from the compound multiplex signal using a band-pass filter. The wavelength fit detector determines a feedback signal by correlating variations of the amplitude of the received signal with variations of the traffic density. This feedback signal is then returned to the transmitter via a back channel and serves to tune the wavelength of the single wavelength optical signal. The feedback signal is positive, if the laser wavelength is to short, and is negative, if the laser wavelength is to long.

The invention allows an automatic stabilization of cheap WDM sources with refaxed requirements on long term stability of parameters. The inherent tunability of semiconductor lasers becomes usable to inexpensive technical implementations. The requirement on long term stability of the wavelength set point(s) is relaxed. Channel tuning can be done by a coarse setting of the required wavelength, followed by an automatic fine tuning to the pass band center by the proposed invention.

Moreover, the invention enables a development towards more dense WDM channels without increased requirements to the laser. Furthermore, the invention allows the use of unstabilized wavelength filters: In WDM applications, where only one de-MUX filter is used (in front of the receiver, e.g. in a passive optical network), the high stability of the filters center frequency is no more required as the laser can follow the filter drift.

BRIEF DESCRIPTION OF THE DRAWINGS

A preferred embodiment of the present invention will now be described with reference to the accompanying drawings in which

FIG. 3 shows in a logarithmic plot the wavelength drift as a function of the time after switch on;

DETAILED DESCRIPTION OF THE INVENTION

Figure 1:
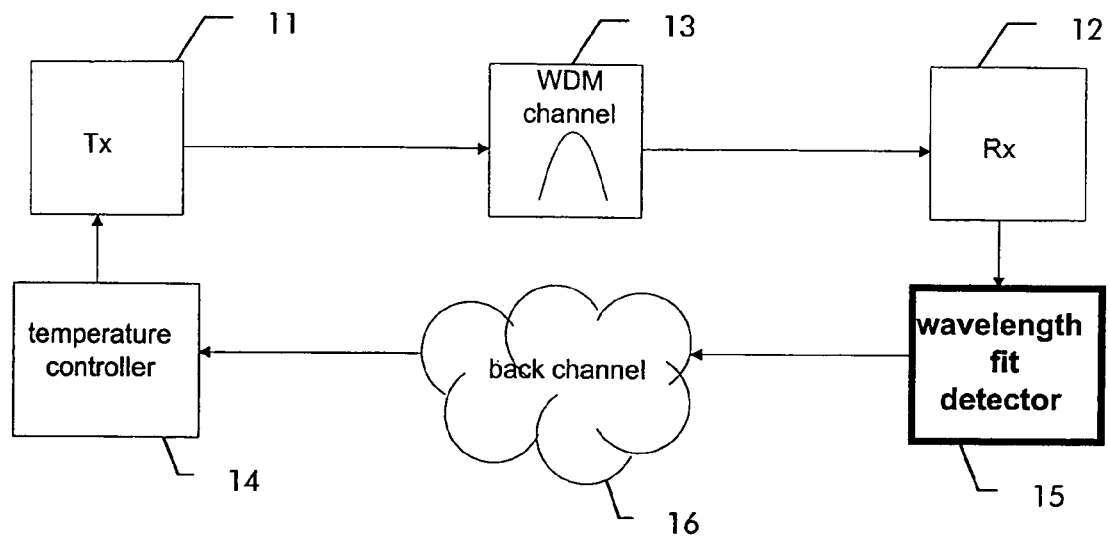
FIG. 1 shows active wavelength control of a transmitter using a wavelength fit detector in a WDM transmission system.

The principle of active wavelength control is shown in FIG. 1. A transmitter 11 including a temperature controlled WDM laser transmits a single wavelength signal a wavelength $\lambda_i$. The signal is transported as a particular WDM channel 13 through the WDM network to a receiver 12. The receiver has a band-pass filter for selecting from the compound WDM signal the particular wavelength of the signal from WDM channel 13. A wavelength fit detector 15, which is connected to the receiver 12, creates a feedback signal that is passed over a back channel 16 of any kind back to the temperature controller 14, which adjusts the wavelength of the transmitter 11 to match the pass-band of the wavelength selector in the receiver 12.

A back channel is available in almost any system, e.g. the OAM channel. This principle is applicable to any burst mode WDM system with directly modulated laser or direct envelope modulated laser.

The invention is based on the recognition that a thorough knowledge of the actual wavelength is not required. What is needed instead is an indication of whether the actual wavelength fits to the center of the WDM filter pass band, or, if not, to which side it diverges. A basic idea of the invention is to determine a feedback signal by correlating variations of the burst amplitude with variations of the traffic density in the receiver. Positive correlation indicates that the wavelength is to short, negative correlation is an indication that the wavelength is to long.

The feedback required for the active control in FIG. 1 is thus determined in the receiver by correlating variations of the burst amplitude with variations of the traffic density. A wavelength fit detector that accomplishes this is shown in more detail in FIG. 2.

The received input signal 21 is split into two branches. In the upper branch, a packet detector 22 detects the presence or absence of a packet. This signal reflects the traffic density (pulse width modulation) and is independent of the amplitude. In the lower branch, a track and hold gate 24, which is controlled by the packet detector 22 in the upper branch, detects the packet amplitude. The output of the track and hold gate 24 reflects the packet amplitude, which is independent of the traffic density, because the track and hold is off during the gaps.

Both output signals are filtered by wide band filters 23 and 25, respectively, so that only spectral components roughly in range 1 kHz-1 MHz are passed. This means that only variations but no absolute values can pass the wide band filters. Next, a multiplier 26 multiplies the filtered signals by each other and the result is passed to a low pass filter 27 (correlation). The output is the desired feedback signal, which is positive, if the laser wavelength is to short, and which is negative, if the laser wavelength is to long.

In a network with multiple transmitters connected to one burst mode receiver (e.g. tree or bus structures) the packet detector contains an additional classification means, that filters packets of only one particular transmitter, e.g. by Tx address label, or by time slot, depending of the particular media access protocol. The clue of this improvement is to select packets from only one particular transmitter which is to be tuned. This selection can be achieved in various ways, such as by source address, by timeslot (TDMA), by code (CDMA), or the like. The assignment of data packets to the originating transmitter and thus the selection criterion depends on the media access protocol used in each individual case. An unambiguous assignment of packets to source should always be possible in any real implementation. How such selection may be achieved is any individual case is, however, immaterial to the present invention and can be worked out by those skilled in the art without undue experimentation.

Figure 3:
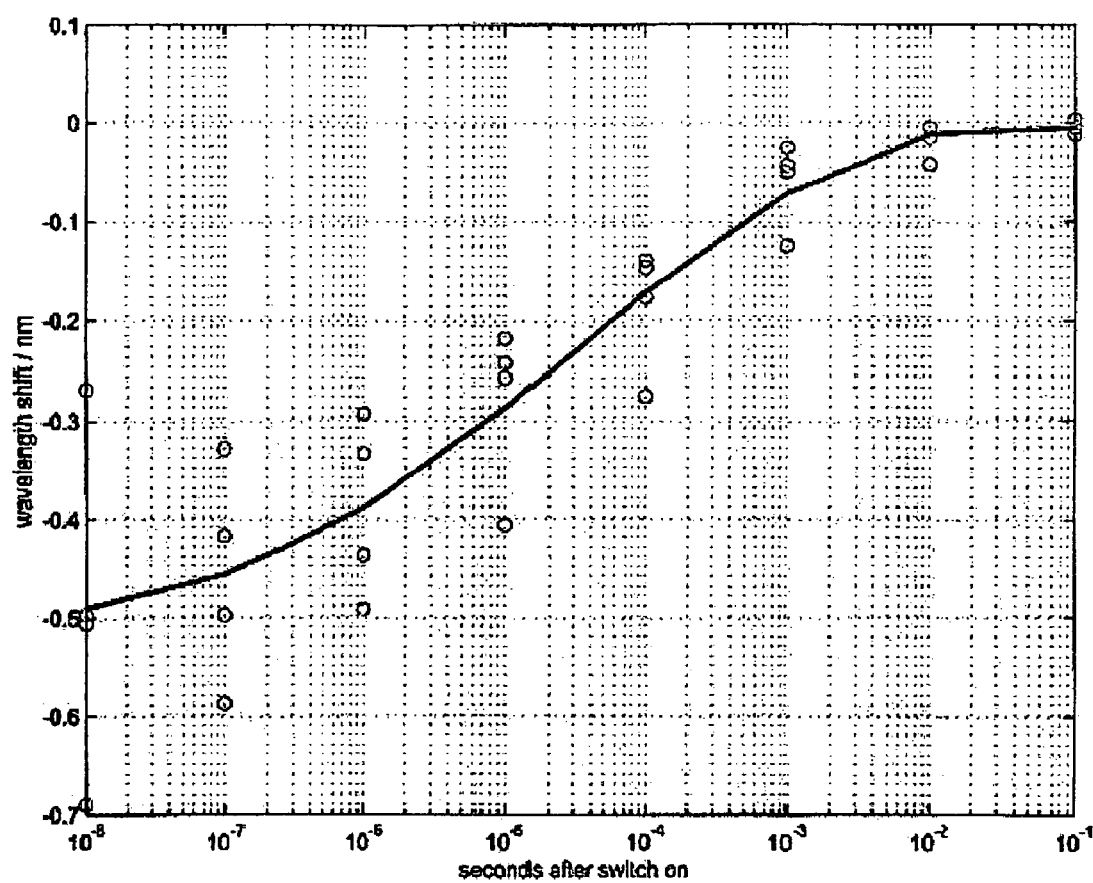

The working principle of the invention now be explored further in the following. A temperature controlled laser chip has a thermal gradient inside the chip. That means the active zone is hotter than the basement. The temperature difference depends on the average power dissipation in the active zone. In burst mode operation the average power depends on the traffic density, even if the particular packets are of equalized power. For example, the measurement in FIG. 3 shows a wavelength shift between low and high traffic density of 0.5 nm in a time scale of 1 μs-1 ms. This way we have a natural positive correlation between traffic density and wavelength. Increasing traffic results in increasing wavelength, reduced traffic will result in lower wavelength.

In the WDM filter, if not correctly tuned, the wavelength variations are translated into amplitude variations. Even though the wavelength variations are quite small, they result in reasonable amplitude variations due to the usually quite sharp WDM filter curves. The correlation between wavelength and amplitude depends on the filter slope we are operating on: On the raising slope we have a positive correlation—increased wavelength results in increased amplitude. On the falling slope we have negative correlation—increased wavelength results in decreased amplitude.

Together with the thermal effect explained above, the input signal of the receiver has a natural positive or negative correlation between traffic density and amplitude, depending on the detuning between laser wavelength and WDM channel filter. This correlation can be calculated by the schematic of FIG. 2.

In case of a small wavelength mismatch between laser and WDM channel, the traffic dependent wavelength modulation translates into an amplitude modulation, which can be used to detect the mismatch in the receiver. Let's assume an optical burst mode system with variable burst size and variable gaps in between. The traffic density $\delta(t)$ is defined as the cumulative length of all packets in a given interval divided by the interval length. $\delta(t)$ is a random variable with an average value $D = \mathbb{E}[\delta(t)]$—the average traffic density, and a variance $V_D = \mathbb{E}[(\delta(t)-D)^2]$, where $\mathbb{E}[x]$ denotes the statistical expectation of x. Let's further assume, that the transmitter emits optical packets of equalized power $P_0$ at an average wavelength $\lambda_N$. The actual wavelength $\lambda(t)$ is a function of the traffic density $\delta(t)$ as explained above, a first order approximation can be given by $$\lambda(t) = \lambda_N + K \cdot (\delta(t) - D) \qquad (1)$$

with K—a positive constant.

A WDM channel has a narrow pass band around a center frequency $\lambda_0$. We expand the pass band transmission function $T(\lambda)$ in as series in the environment of $\lambda_0$:

$$T(\lambda) \approx T_0 + T_2 \cdot (\lambda - \lambda_0)^2 \qquad (2)$$

$T_0$ denotes the power transmission in the pass band center $\lambda_0$, while $T_2$ describes an additional attenuation towards the borders of the pass band, $T_2 < 0$. The packet power at the receiver side is given by $$P(\lambda) = T(\lambda) \cdot P_0 \qquad (3)$$

$$P(\lambda) = P_0(T_0 + T_2 \cdot (\lambda - \lambda_0)^2) \qquad (4)$$

replacing λ by λ(t) from equation (1) we get the packet power as random function of time $$P(t)=P_0(T_0+T_2 \cdot (\lambda_N+K \cdot (\delta(t)-D)-\lambda_0)^2) \quad (5)$$

from which we derive the average packet power at the receiver as:

$$E[P(t)]=P_0(T_0+T_2 \cdot ((\lambda_N-\lambda_0)^2+K^2 \cdot V_D)) \quad (6)$$

and the centered packet power variations $$P(t)-E[P(t)]=2P_0T_2(K(\lambda_N-\lambda_0)(\delta(t)-D)+K^2((\delta(t)-D)^2-V_D)) \quad (7)$$

The cross correlation between the packet power variations at receiver input and the traffic density variations is then $$\Psi_{P\delta}=E[(P(t)-E[P(t)]) \cdot (\delta(t)-E[\delta(t)])] \quad (8)$$

taking into account (5) and (6) we get $$\Psi_{P\delta}=2P_0T_2KV_D(\lambda_N-\lambda_0) \quad (9)$$

with $P_0$, $K$, $V_D$ always positive, while $T_2$ is negative as long as the pass band transmission of the channel filter is concave.

Figure 2:
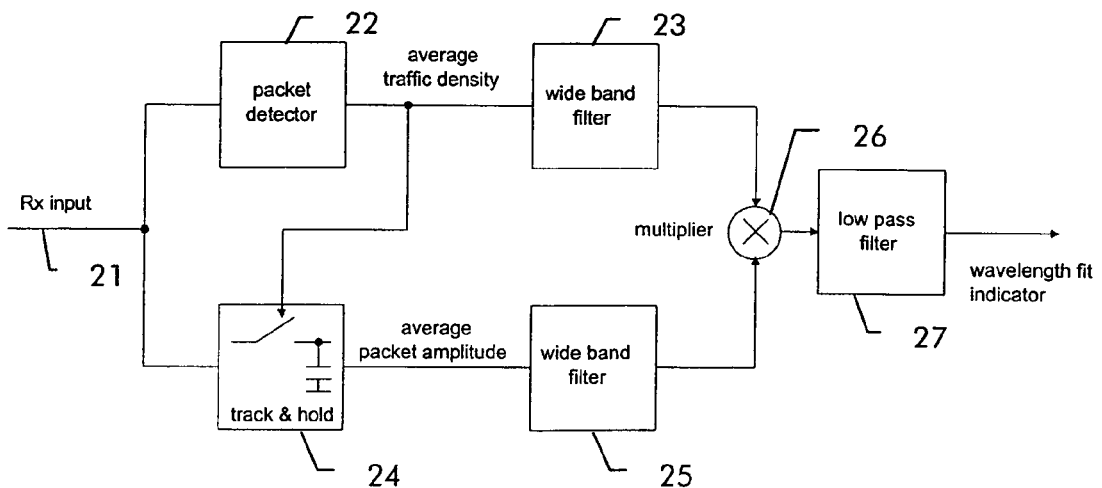
FIG. 2 shows a wavelength fit detector for use in the system of FIG. 1.

In other words, the cross correlation between packet power variations and traffic density variations is positive, if the laser wavelength $\lambda_N$ is too low with respect to the center wavelength $\lambda_0$ of the pass band ($\lambda_N<\lambda_0$), the cross correlation is negative, if $\lambda_N$ is too high ($\lambda_N>\lambda_0$). The equilibrium condition $\Psi_{P\delta}=0$ at $\lambda_N=\lambda_0$ is independent of other parameters. However, the sensitivity of the method depends on the actual signal power $P_0$, the bending of the WDM filter pass band $T_2$, the thermal "flexibility" of the laser chip $K$, and on the variance of traffic density $V_D$. Equations (8) and (9) can be used to implement a simple detector for the actual matching between laser wavelength and WDM channel filter. The cross correlation $\Psi_{P\delta}$ can be estimated by replacing in equation (8) the statistical expectation operator $\mathbb{E}[x]$ by the (short term) average in time. In a strong sense this is valid only for ergodic signals, nevertheless, under certain circumstances it yields acceptable estimates for other signal classes, too. FIG. 2 shows the block diagram of the resulting detector.

The traffic density variations ($\delta(t)-\mathbb{E}[\delta(t)]$) are estimated by a comparator and a wide band filter. The comparator determines packet presence or absence, which results in a kind of traffic density dependent pulse width modulation. The low pass part of the band filter translates the pulse wide modulation into an amplitude ($\sim\delta(t)$). The high pass part removes the longer term average component ($\sim\mathbb{E}[\delta(t)]$).

Packet power level variations ($P(t)-\mathbb{E}[P(t)]$) can be estimated by a sampling stage together with a wide band filter. It samples the packet amplitudes, while the low pass filter part interpolates during the gaps. Equally as above, the high pass component removes the long term average level. Please note the difference between packet power and signal power: Signal power is an average between packet power and zero during the gaps. It depends directly on the actual traffic density. By sampling the packets only and interpolating during the gaps the direct traffic dependence can be removed.

For correlation both signals (traffic density and power level) are feed to a multiplier followed by another low pass. The output signal is either positive or negative, depending on the position of the laser wavelength relative to the WDM channel filter. It can be propagated back to the transmitter to adjust the laser controller accordingly.

Figure 4A:
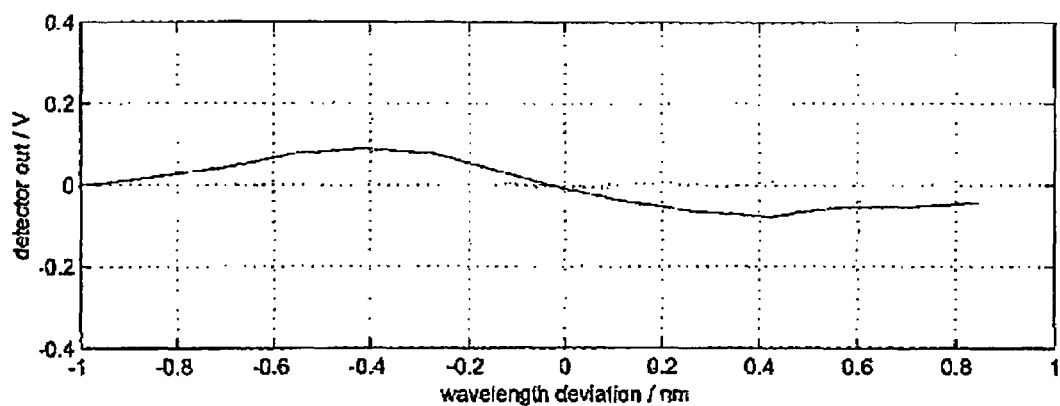
FIG. 4a shows in a plot the detector output voltage against the wavelength deviation.
Figure 4B:
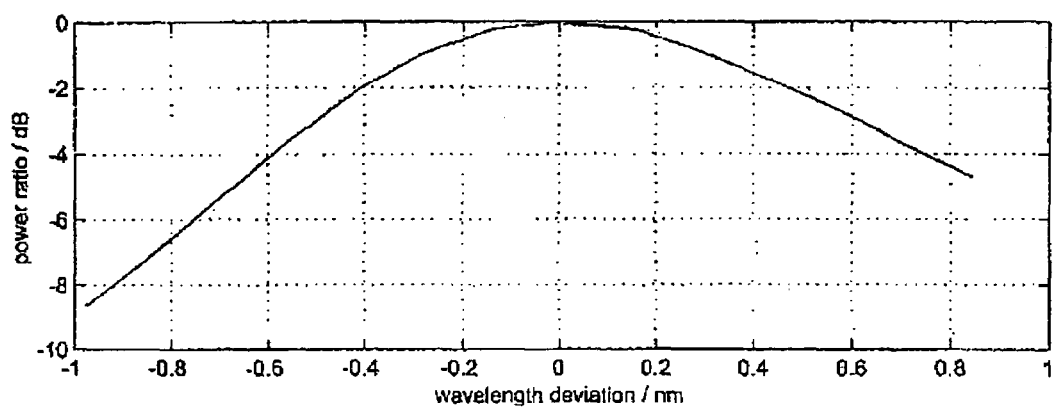
FIG. 4b shows in a plot the corresponding WDM channel filter pass band.

The detector concept has been tested with an existing optical burst mode prototype. The optical packets had a line rate of 10 GBit/s. Payload traffic source was a Gigabit Ethernet tester with appropriate encapsulation and speed up. Due to the low data rate of the traffic source the density on the 10 GBit/s channel varied only between 0 and 10%. Anyway, the optical spectrum analyzer showed the expected spectral spreading by 0.1-0.2 nm as compared to constant laser operation. The detector is independent of the 10 GBit/s burst mode receiver. It uses an additional lower speed optical receiver (<100 MHz) and few industry standard analogue components. Filter characteristics of the two wide band filters are: Lower band limit 200 Hz, first order. Upper band limit 20 kHz, second order Bessel filter. Band limit of the correlator low pass is 20 Hz. FIG. 4a shows the measured correlator output and FIG. 4b shows the WDM channel transmission as function of the laser wavelength.

The detector concept enables a permanent control of the laser-to-filter match in a burst mode WDM system during normal operation. It removes the need for a life time stability of the laser wavelength, a initial coarse set point in range of the filter pass band is sufficient. The concept is almost line rate independent, the highest required speed is less than 1/100 of the line rate. The relative low speed requirements make even software implementations attractive.

Extensions of the concept are directed on: (a) Account for a possible traffic dependence of the transmitter power itself. (b) Selective use of periods with high variance for better sensitivity. (c) Compensation of phase shift between traffic changes and wavelength changes. (d) Additional source address filter in case several transmitters are sending packets to one receiver.

Ideally, in a transmitter with real burst mode and variable traffic, the required correlation is there without further intervention. All effort is concentrated in the receiver. However, in some cases it could be required to use a special training pattern to activate the desired effects (low-high traffic alternations), for example at start up or if the normal operation of the laser is not burst mode.

The schematics in FIG. 1 operates independent of the underlying bit rate. It is fast enough if the track and hold gate catches the shortest possible packet. In practice for a 10 GBit/s system the packet detector and track and hold are limited to 100 MHz. The correlation itself is limited to less than 1 MHz and can be moved into some digital controller or even into software.

The photo diode in the receiver is not necessarily the real line rate photo diode, it could be equally good a lower speed monitor photo diode on a tap somewhere in the channel. A feedback channel from the receiver to the transmitter is required to propagate the tuning indicator back to the laser controller in the transmitter. Normally this can be done by the normal operation and maintenance channel (OAM). The speed of this channel limits the tuning speed, however, if talking about thermal wavelength tuning, time frames of several seconds are usual anyway.

Having described a preferred embodiment of the invention, it should be clear to those skilled in the art, that various modifications, alterations of substitutions could be made without departing from the spirit and concepts of the invention. For instance, the laser wavelength control in the embodiment is achieved by controlling the temperature of the laser device. While this is indeed a preferred and illustrative embodiment, it should be clear that any other means for controlling the laser wavelength, such as a control of the bias voltage of a laser diode, is equally suitable to carry out the invention.

What is claimed is:

1. A wavelength fit detector for determining in a wavelength division multiplex system, which operates in an optical burst mode, whether a received signal wavelength matches a predefined pass-band of a wavelength selector; said detector comprising means for determining a feedback signal by correlating variations of the amplitude of the received signal with variations of the traffic density of the received signal, wherein the variations of the amplitude of the received signal are caused by the variations in the traffic density which occur due to the system operating in the optical burst mode.

2. A wavelength fit detector according to claim 1, comprising a packet detector and a track and hold gate controlled by said packet detector, both being connected to a signal input and leading to a multiplier.

3. A wavelength fit detector according to claim 2, further comprising a low pass filter connected to the output of said multiplier.

4. A wavelength fit detector according to claim 2, further comprising two wide band filters respectively connected between said packet detector and said multiplier and between said track and hold gate and said multiplier.

5. A wavelength fit detector according to claim 1, comprising means for selecting data packets originating from the same transmitter.

6. A receiver for a WDM system comprising a wavelength fit detector according to claim 1.

7. The detector according to claim 1, comprising:
   a track and hold gate which detects the amplitude of a signal; and
   a packet detector which detects an absence or a presence of packets and switches the track and hold gate to an "ON" state when the presence of the packet is detected.

8. The detector according to claim 1, further comprising:
   a multiplier which receives signals produced by the track and hold gate and the packet detector and calculates a product of the received signals; and
   a low pass filter which filters the calculated product to obtain the feedback signal.

9. A transmitter for a WDM system comprising a tunable laser light source for emitting a burst mode single wavelength optical signal and a control means for stabilizing the wavelength at which said laser light source emits, characterized by an input for a feedback signal obtained by a remote wavelength fit detector by correlating variations of the amplitude of a received signal with variations of the traffic density of the received signal.

10. A transmitter according to claim 9, further comprising means for determining periods with high traffic variance, said means controlling said control means to adjust said wavelength only during said high traffic variance periods.

11. A method for wavelength control in a WDM system which operates in an optical burst mode, comprising the steps of:
   emitting a single wavelength optical signal at a transmitter;
   transmitting said single wavelength optical signal as a wavelength channel in a compound multiplex signal through said WDM system;
   selecting at the receiver side said single wavelength optical signal from said compound multiplex signal;
   correlating variations of the amplitude of said received signal with variations of the traffic density of the received single wavelength optical signal to obtain a feedback signal, wherein the variations of the amplitude of the received signal are caused by the variations in the traffic density which occur due to the system operating in the optical burst mode;
   transmitting said feedback signal via a back channel to said transmitter; and
   tuning the wavelength of said single wavelength optical signal according to said feedback signal.

12. A method according to claim 11, wherein said single wavelength optical signal contains a training pattern comprising low and high traffic alternations.

13. A method according to claim 11, wherein in said tuning step a traffic dependence of the transmitter power itself is taken into account.

14. A method according to claim 11, wherein said tuning step is only carried out during periods with high traffic variance.

15. A method according to claim 11, further comprising the step of compensating an inherent delay between traffic changes and wavelength changes.

* * * * *